US009576888B2

(12) United States Patent
Chen et al.

(10) Patent No.: US 9,576,888 B2
(45) Date of Patent: Feb. 21, 2017

(54) PACKAGE ON-PACKAGE JOINT STRUCTURE WITH MOLDING OPEN BUMPS

(71) Applicant: Taiwan Semiconductor Manufacturing Company, Ltd., Hsin-Chu (TW)

(72) Inventors: Meng-Tse Chen, Changzhi Township (TW); Chun-Cheng Lin, New Taipei (TW); Wei-Yu Chen, Taipei (TW); Ai-Tee Ang, Hsin-Chu (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/159,159

(22) Filed: Jan. 20, 2014

(65) Prior Publication Data

US 2014/0264858 A1 Sep. 18, 2014

Related U.S. Application Data

(60) Provisional application No. 61/777,822, filed on Mar. 12, 2013.

(51) Int. Cl.
*H01L 23/498* (2006.01)
*H01L 25/10* (2006.01)
(Continued)

(52) U.S. Cl.
CPC ... *H01L 23/49811* (2013.01); *H01L 23/49816* (2013.01); *H01L 24/14* (2013.01); *H01L 25/0657* (2013.01); *H01L 25/105* (2013.01); *H01L 25/50* (2013.01); *H01L 23/3128* (2013.01); *H01L 23/49827* (2013.01); *H01L 24/05* (2013.01); *H01L 24/06* (2013.01); *H01L 24/11* (2013.01); *H01L 24/13* (2013.01); *H01L 24/16* (2013.01); *H01L 24/32* (2013.01); *H01L 24/73* (2013.01); *H01L 24/81* (2013.01); *H01L 2224/0401* (2013.01); *H01L 2224/0557* (2013.01); *H01L 2224/05572* (2013.01);
(Continued)

(58) Field of Classification Search
CPC ............... H01L 24/81; H01L 23/49816; H01L 23/49811
USPC .................................. 257/737–738; 438/126
See application file for complete search history.

(56) References Cited

U.S. PATENT DOCUMENTS 8,546,194 B2 * 10/2013 Choi ................ H01L 23/49811 257/775
2004/0178481 A1 * 9/2004 Joshi et al. .................. 257/678
(Continued)

FOREIGN PATENT DOCUMENTS

CN 102646668 A 8/2012

*Primary Examiner* — Christine Enad
(74) *Attorney, Agent, or Firm* — Slater Matsil, LLP

(57) ABSTRACT

A device comprises a bottom package comprising a plurality of metal bumps formed on a first side of the bottom package and a plurality of first bumps formed on a second side of the bottom package, a top package bonded on the bottom package, wherein the top package comprises a plurality of second bumps, and wherein second bumps and respective metal bumps form a joint structure and an underfill layer formed between the top package and the bottom package, wherein the metal bumps are embedded in the underfill layer.

20 Claims, 11 Drawing Sheets

100
302
304 304
114 202 116
102
104 104 104 104 103

1000
302
202
914 916
102
104 104 104 104

(51) Int. Cl.

| | |
|---|---|
| ***H01L 25/00*** | (2006.01) |
| ***H01L 25/065*** | (2006.01) |
| *H01L 23/31* | (2006.01) |
| *H01L 23/00* | (2006.01) |

(52) U.S. Cl.

CPC ............... *H01L 2224/06181* (2013.01); *H01L 2224/1134* (2013.01); *H01L 2224/13147* (2013.01); *H01L 2224/1403* (2013.01); *H01L 2224/14051* (2013.01); *H01L 2224/14181* (2013.01); *H01L 2224/16145* (2013.01); *H01L 2224/16146* (2013.01); *H01L 2224/16225* (2013.01); *H01L 2224/32145* (2013.01); *H01L 2224/32225* (2013.01); *H01L 2224/73265* (2013.01); *H01L 2224/81815* (2013.01); *H01L 2225/0651* (2013.01); *H01L 2225/06513* (2013.01); *H01L 2225/06541* (2013.01); *H01L 2225/06568* (2013.01); *H01L 2225/1023* (2013.01); *H01L 2225/1058* (2013.01); *H01L 2924/00014* (2013.01); *H01L 2924/12042* (2013.01); *H01L 2924/15311* (2013.01); *H01L 2924/15331* (2013.01); *H01L 2924/181* (2013.01); *H01L 2924/18161* (2013.01)

(56) References Cited

U.S. PATENT DOCUMENTS

| | | | | |
|---|---|---|---|---|
| 2010/0072598 | A1* | 3/2010 | Oh et al. | 257/686 |
| 2010/0132998 | A1* | 6/2010 | Lee | H01L 23/49816 174/267 |
| 2012/0038040 | A1* | 2/2012 | Jang et al. | 257/737 |
| 2012/0068334 | A1* | 3/2012 | Migita et al. | 257/737 |
| 2012/0211885 | A1* | 8/2012 | Choi et al. | 257/737 |
| 2013/0099385 | A1* | 4/2013 | Chen et al. | 257/773 |
| 2013/0175687 | A1* | 7/2013 | Hu | H01L 21/56 257/738 |
| 2013/0249106 | A1* | 9/2013 | Lin et al. | 257/774 |
| 2014/0084487 | A1* | 3/2014 | Zhao et al. | 257/777 |

* cited by examiner

900

PACKAGE ON-PACKAGE JOINT STRUCTURE WITH MOLDING OPEN BUMPS

This application claims the benefit of U.S. Provisional Application No. 61/777,822 filed on Mar. 12, 2013, entitled "Package-on-Package Joint Structure" which is hereby incorporated herein by reference in its entirety.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

As semiconductor technologies further advance, package-on-package semiconductor devices have emerged as an effective alternative to further reduce the physical size of a semiconductor device. In a package on package semiconductor device, active circuits such as logic, memory, processor circuits and the like are fabricated on different wafers and packages. Two or more packages are installed on top of one another, i.e. stacked, with a standard interface to route signals between them. Much higher density can be achieved by employing package on package semiconductor devices. Furthermore, package on package semiconductor devices can achieve smaller form factors, cost-effectiveness, increased performance and lower power consumption.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a package-on-package semiconductor device with a copper ball based joint structure. The embodiments of the disclosure may also be applied, however, to a variety of semiconductor devices. Hereinafter, various embodiments will be explained in detail with reference to the accompanying drawings.

Figure 1:
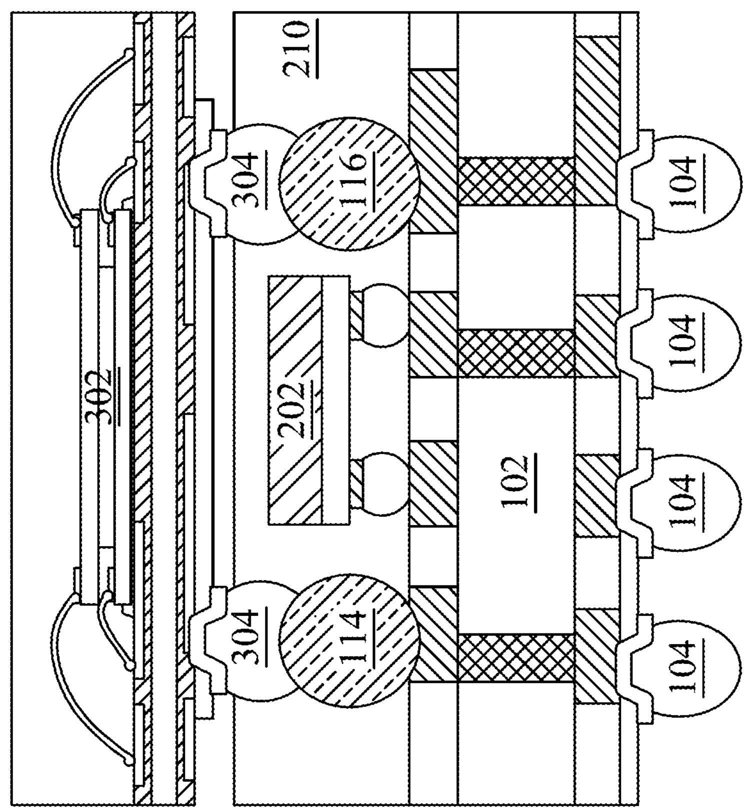
FIG. 1 illustrates a cross sectional view of a package-on-package semiconductor device in accordance with various embodiments of the present disclosure.

FIG. 1 illustrates a cross sectional view of a package-on-package semiconductor device in accordance with various embodiments of the present disclosure. The package-on package semiconductor device 100 may include a bottom package 102 and a top package 302. In particular, the top package 302 is stacked on top of the bottom package 102. In addition, the top package 302 and the bottom package 102 are bonded together through a joint structure formed by bumps 114, 116 and solder balls 304. As shown in FIG. 1, the joint structure includes two solder covered bumps, which are generated by a reflow process. The reflow process will be described below with respect to FIG. 8.

In some embodiments, bumps 114 and 116 are formed of metal materials such as copper. Throughout the description, the bumps 114 and 116 are alternatively referred to as metal bumps or copper balls 114 and 116.

A semiconductor die 202 is bonded on a first side of the bottom package 102. There may be a plurality of bumps coupled between the semiconductor die 202 and the bottom package 102. The detailed bonding process as well as the structure of the semiconductor die 202 will be described below with respect to FIG. 3.

A plurality of bumps 104 is formed on a second side of the bottom package 102. There may be a plurality of under bump metallization (UBM) structures formed underneath the bumps 104. The detailed formation processes of the bumps 104 and the UBM structures will be described below with respect to FIG. 6.

As shown in FIG. 1, an underfill layer 210 is formed between the top package 302 and the bottom package 102. The copper balls 114 and 116, and the semiconductor die 202 are embedded in the underfill layer 210. The solder balls 304 are partially embedded in the underfill layer 210. It should be noted that the number of bumps (e.g., copper balls 114 and 116) shown in FIG. 1 is merely an example. A person skilled in the art will recognize that the package-on package semiconductor device 100 may accommodate any number of bumps. It should further be noted that the underfill layer 210 shown in FIG. 1 is merely an example. One person skilled in the art will recognize there may be many variations, modifications and alternatives. For example, the top surface of the underfill layer 210 may be coplanar with the top surface of the semiconductor die 202.

FIGS. 2-8 illustrate intermediate steps of fabricating the package-on-package semiconductor device shown in FIG. 1 in accordance with various embodiments of the present disclosure. It should be noted that the fabrication steps as well as the package-on-package structure shown in FIGS. 2-8 are merely an example. A person skilled in the art will recognize there may be many alternatives, variations and modifications.

Figure 2:
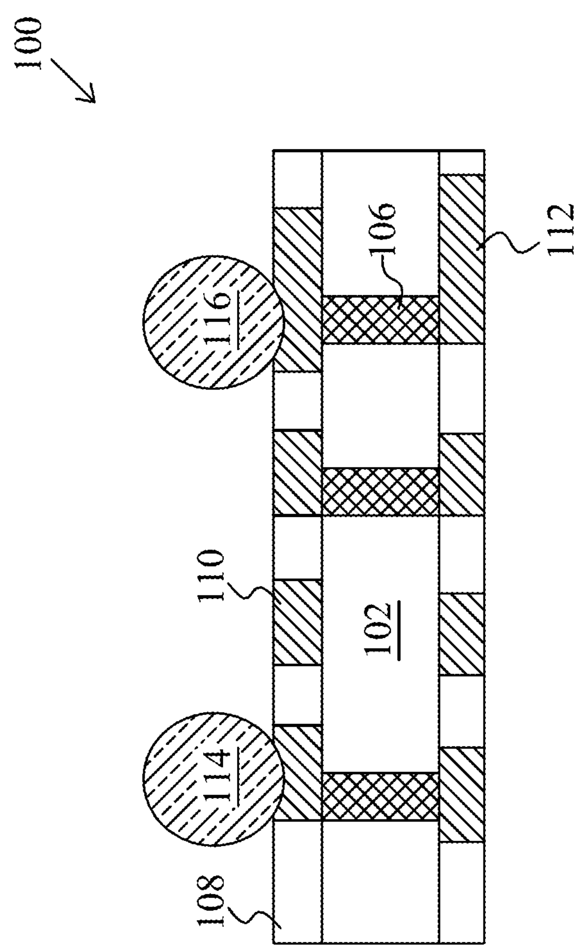
FIG. 2 illustrates a cross sectional view of a bottom package in accordance with various embodiments of the present disclosure.

FIG. 2 illustrates a cross sectional view of a bottom package in accordance with various embodiments of the present disclosure. The bottom package 102 may be a silicon substrate. Alternatively, the bottom package 102 may be other suitable structures such as a glass interposer.

In some embodiments, the bottom package 102 may be formed of silicon, although it may also be formed of other group III, group IV, and/or group V elements, such as silicon, germanium, gallium, arsenic, and combinations thereof. The bottom package 102 may comprise a bulk substrate or a silicon-on-insulator (SOI) substrate.

According to alternative embodiments, the bottom package 102 may be made of other suitable materials such as ceramic materials, organic materials, any combinations thereof and/or the like.

The bottom package 102 may comprise a plurality of integrated circuits (not shown), each of which may comprise various layers such as active circuit layers, substrate layers, inter layer dielectric (ILD) layers and inter-metal dielectric (IMD) layers (not shown respectively). The bottom package 102 may further comprise a plurality of through vias. In some embodiments, the through vias are through-substrate vias (TSVs) or through-silicon vias (TSVs), such as TSVs 106. The TSV 106 may be filled with a conductive material such as copper, tungsten and/or the like. The active circuit layers (not shown) of the bottom package 102 may be coupled to external circuits (not shown) formed over the bottom package 102 through the plurality of TSVs (e.g., TSV 106).

A dielectric layer 108 is formed over the bottom package 102. The dielectric layer 108 may be alternatively referred to as an ILD layer 108 hereinafter. In some embodiments, the ILD layer 108 is formed of a photo-sensitive material such as polybenzoxazole (PBO), polyimide, benzocyclobutene (BCB), any combinations thereof and/or the like, which may be easily patterned using a lithography mask. In alternative embodiments, the ILD layer 108 may be formed of a nitride such as silicon nitride, an oxide such as silicon oxide, phosphosilicate glass (PSG), borosilicate glass (BSG), boron-doped phosphosilicate glass (BPSG), any combinations thereof and/or the like. The ILD layer 108 may be formed by suitable fabrication techniques such as such as spinning, chemical vapor deposition (CVD), and plasma enhanced CVD (PECVD) and/or the like.

As shown in FIG. 2, a first redistribution layer 110 is formed over a first side of the bottom package 102. More particularly, the first redistribution layer 110 provides a conductive path between TSVs (e.g., TSV 106) and the metal bumps subsequently formed over the bottom package 102. The first redistribution layer 110 may be formed of metal materials such as aluminum, aluminum alloys, copper or copper alloys and the like.

A second redistribution layer 112 may be formed on a second side of the bottom package 102. The material and the formation method of the second redistribution layer 112 may be similar to that of the first redistribution layer 110 described above. Therefore, explicit description of the formation of the second redistribution layer 112 is omitted to avoid unnecessary repetition.

FIG. 2 further illustrates that a plurality of copper balls 114 and 116 are mounted over the first side of the bottom package 102. In particular, the copper balls 114 and 116 are mounted on a connector. The connector may be a redistribution line, a metal line, a bond pad and/or the like. The copper balls may be bonded on the bottom package 102 through suitable bonding processes such as a reflow soldering process and/or the like.

Figure 3:
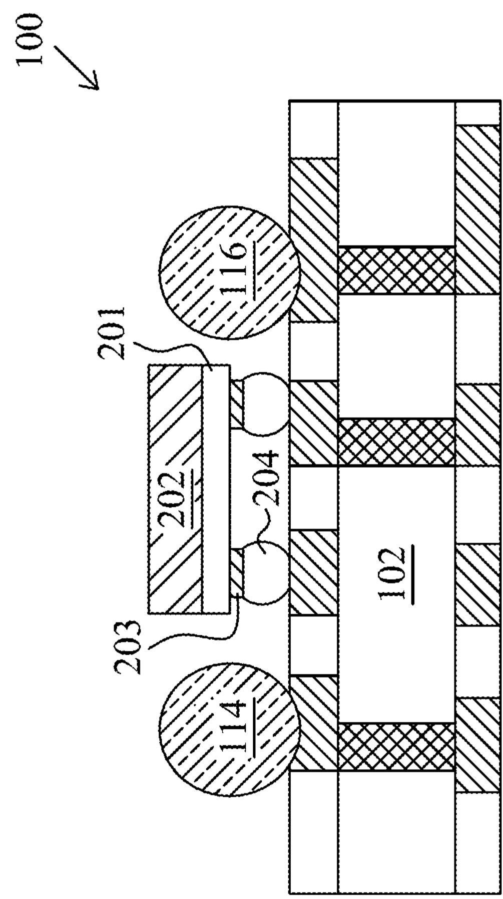
FIG. 3 illustrates a cross sectional view of the semiconductor device shown in FIG. 2 after a semiconductor die is mounted on the bottom package in accordance with various embodiments of the present disclosure.

FIG. 3 illustrates a cross sectional view of the semiconductor device shown in FIG. 2 after a semiconductor die is mounted on the bottom package in accordance with various embodiments of the present disclosure. The semiconductor die 202 is picked and placed on top of the bottom package 102. After a reflow process, the semiconductor die 202 is bonded on the bottom package 102 through the bumps 204, which are coupled between the bottom package 102 and the semiconductor die 202.

In some embodiments, the bonding process may be a suitable fabrication process such as a bump on trace (BOT) process and/or the like. The detailed processes of bonding semiconductor dies on a bottom package are well known in the art, and hence are not discussed herein. It should be noted that while FIG. 3 illustrates a single semiconductor die bonded on the bottom package 102, the bottom package 102 may accommodate any number of semiconductor dies.

In order to give a basic insight of the inventive aspects of various embodiments, the semiconductor die 202 is drawn without details. However, it should be noted that the semiconductor die 202 may comprise basic semiconductor layers such as active circuit layers, substrate layers, ILD layers and IMD layers (not shown respectively).

The semiconductor die 202 may comprise a substrate (not shown). The substrate may be a silicon substrate. Alternatively, the substrate may be a silicon-on-insulator substrate. The substrate may further comprise a variety of electrical circuits (not shown). The electrical circuits formed on the substrate may be any type of circuitry suitable for a variety of applications such as logic circuits.

In some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An isolation layer 201 is formed on the substrate. The isolation layer 201 may be formed, for example, of a dielectric material, such as silicon oxide. The isolation layer 201 may be formed by any suitable method known in the art, such as spinning, CVD, PECVD and the like. It should also be noted that one skilled in the art will recognize that the isolation layer 201 may further comprise a plurality of dielectric layers.

A redistribution layer 203 is formed on the isolation layer 201. The active circuit layer (not shown) of the semiconductor die 202 may be bridged by the redistribution layer 203 so that the active circuit layer of the semiconductor die 202 can be coupled to the input and output terminals of the semiconductor die 202. A plurality of UBM structures (not shown) may be formed on the redistribution layer 203. The UBM structures may help to prevent diffusion between the bumps (e.g., bumps 204) and the integrated circuits of the semiconductor die 202, while providing a low resistance electrical connection.

The bumps (e.g., bumps 204) provide an effective way to connect the semiconductor die 202 with the bottom package 102. The bumps are I/O terminals of the semiconductor die 202. In some embodiments, the bumps (e.g., bumps 204) may be a plurality of solder balls, which are commonly known as fine-pitch micro bumps. Alternatively, the bumps (e.g., bumps 204) may be a plurality of ball grid array (BGA) balls.

Figure 4:
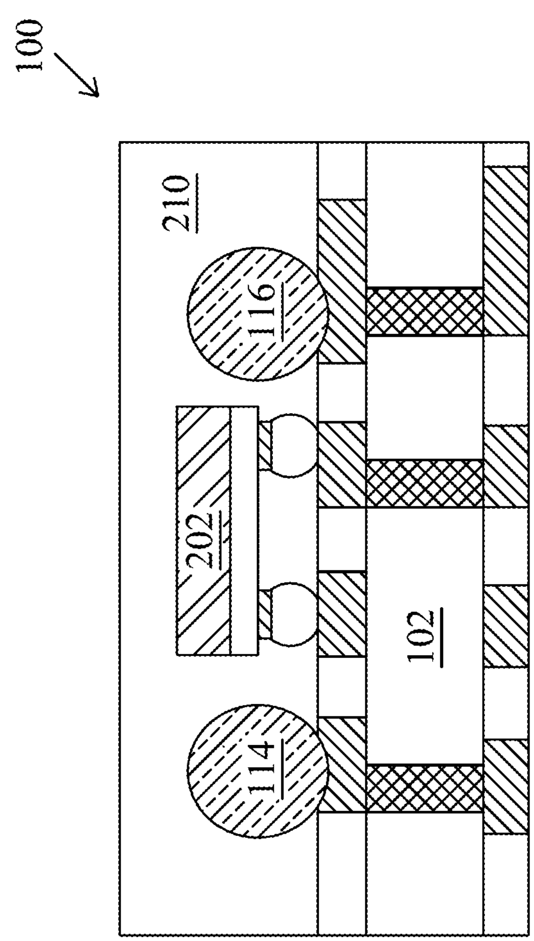
FIG. 4 illustrates a cross sectional view of the semiconductor device shown in FIG. 3 after an encapsulation layer is formed over the wafer in accordance with various embodiments of the present disclosure.

FIG. 4 illustrates a cross sectional view of the semiconductor device shown in FIG. 3 after an encapsulation layer is formed over the wafer in accordance with various embodiments of the present disclosure. The encapsulation layer 210 is formed over the bottom package 102 as shown in FIG. 4. In accordance with some embodiments, the encapsulation layer 210 may be a molding compound layer formed of suitable underfill materials. Throughout the description, the encapsulation layer 210 may be alternatively referred to as an underfill layer 210.

The underfill material layer 210 may fill the gaps between the semiconductor die 202 and bumps mounted on top of the bottom package 102. In some embodiments, the underfill material layer 210 may be formed of an epoxy, which is dispensed at the gaps between the bumps and the semiconductor die 202. The epoxy may be applied in a liquid form, and may harden after a curing process.

In alternative embodiments, the underfill material layer 210 may be formed of curable materials such as polymer based materials, resin based materials, polyimide, epoxy and any combinations of thereof. The underfill material layer 210 can be formed by any suitable dispense techniques.

Figure 5:
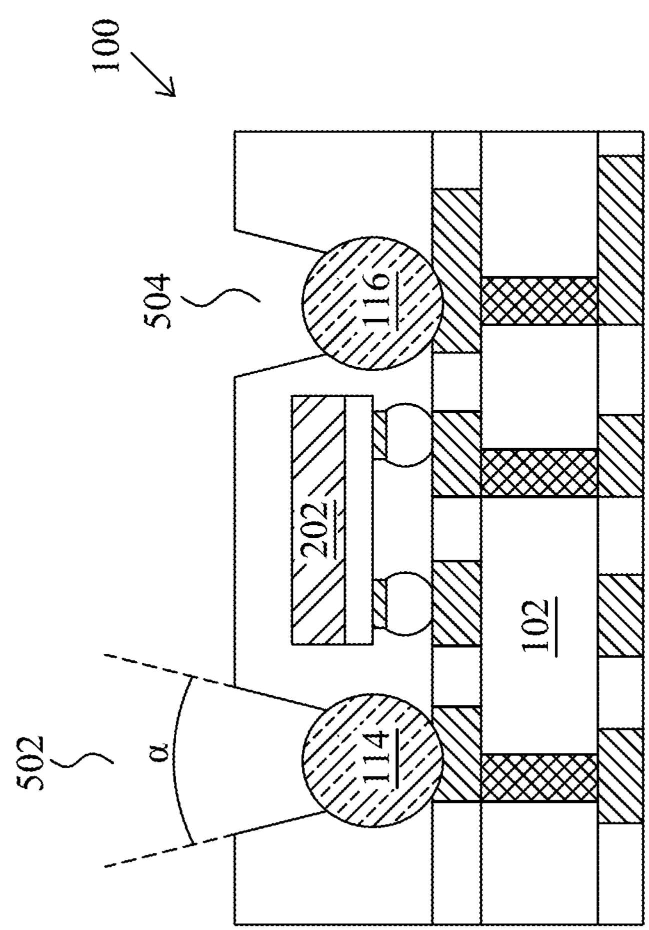
FIG. 5 illustrates a cross sectional view of the semiconductor device shown in FIG. 4 after a plurality of openings are formed in the encapsulation layer in accordance with various embodiments of the present disclosure.

FIG. 5 illustrates a cross sectional view of the semiconductor device shown in FIG. 4 after a plurality of openings are formed in the encapsulation layer in accordance with various embodiments of the present disclosure. Openings 502 and 504 are formed by suitable fabrication processes such as an etching process, a laser ablation process, a mechanical machining process, a laser assisted etching process, any combinations thereof and/or the like. As shown in FIG. 5, the top portions of copper balls 114 and 116 are exposed after the openings 502 and 504 are formed. Throughout the description, the copper balls 114 and 116 may be alternatively referred to as molding open bumps.

In some embodiments, openings 502 and 504 are V-shaped openings. The sidewalls of the V-shaped openings (e.g., opening 502) form an angle $\alpha$ as shown in FIG. 5. In some embodiments, the angle $\alpha$ is about 60 degrees.

Figure 6:
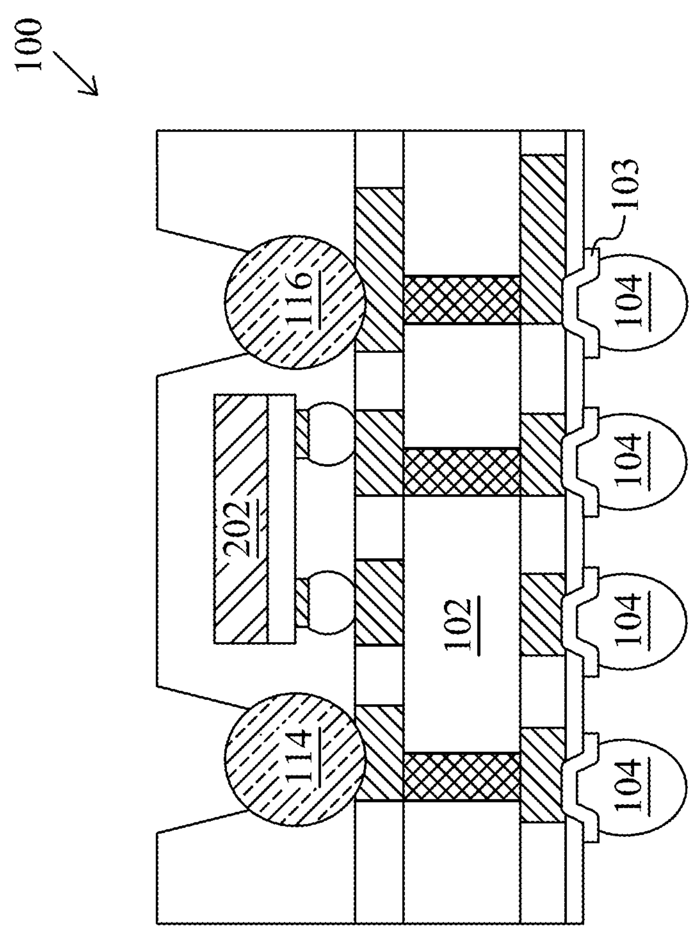
FIG. 6 illustrates a cross sectional view of the semiconductor device shown in FIG. 5 after a plurality of under bump metallization (UBM) structures and interconnection pads are formed in accordance with various embodiments of the present disclosure.

FIG. 6 illustrates a cross sectional view of the semiconductor device shown in FIG. 5 after a plurality of UBM structures and interconnection pads are formed in accordance with various embodiments of the present disclosure. The plurality of UBM structures 103 are formed over the redistribution layer. The UBM structures 103 help to prevent diffusion between the solder balls and the integrated circuits of the semiconductor device, while providing a low resistance electrical connection.

The interconnection pads 104 are input/output (I/O) pads of the semiconductor device. In accordance with an embodiment, the interconnection pads may be a plurality of solder balls 104. In some embodiments, the solder balls 104 may comprise SAC405. SAC405 comprises 95.5% Sn, 4.0% Ag and 0.5% Cu. Alternatively, the interconnection pads may be a plurality of land grid array (LGA) pads.

Figure 7:
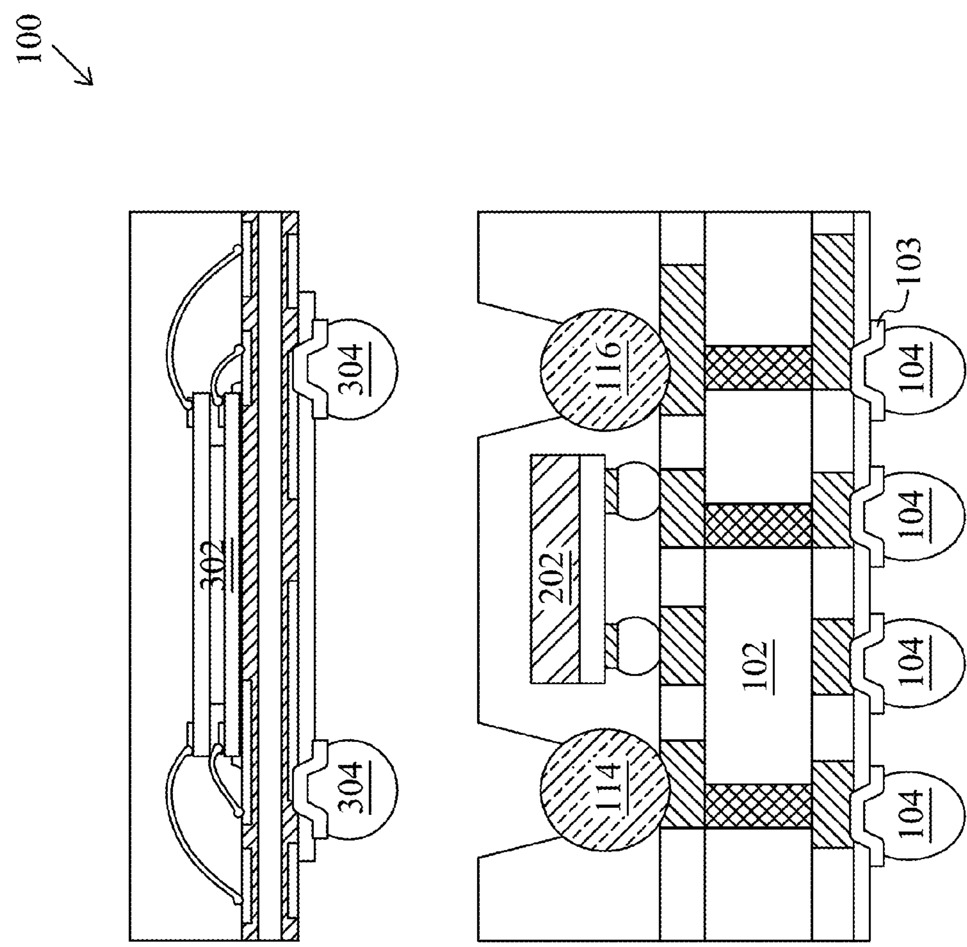
FIG. 7 illustrates a cross sectional view of the semiconductor device shown in FIG. 6 before a top package is mounted on the bottom package in accordance with various embodiments of the present disclosure.

FIG. 7 illustrates a cross sectional view of the semiconductor device shown in FIG. 6 before a top package is mounted on the bottom package in accordance with various embodiments of the present disclosure. The top package 302 may comprise a plurality of stacked dies, which may be wire bonded to the input and output terminals of the top package 302. The stacked dies of the top package 302 may comprise memory dies, logic dies, processor dies and/or the like. It should be noted while FIG. 7 illustrates two stacked dies in the top package 302, this is merely an example. Likewise, the use of wire bonding is merely illustrative and other approaches for electrically connecting the stacked dies are within the contemplated scope of the present disclosure.

Figure 8:
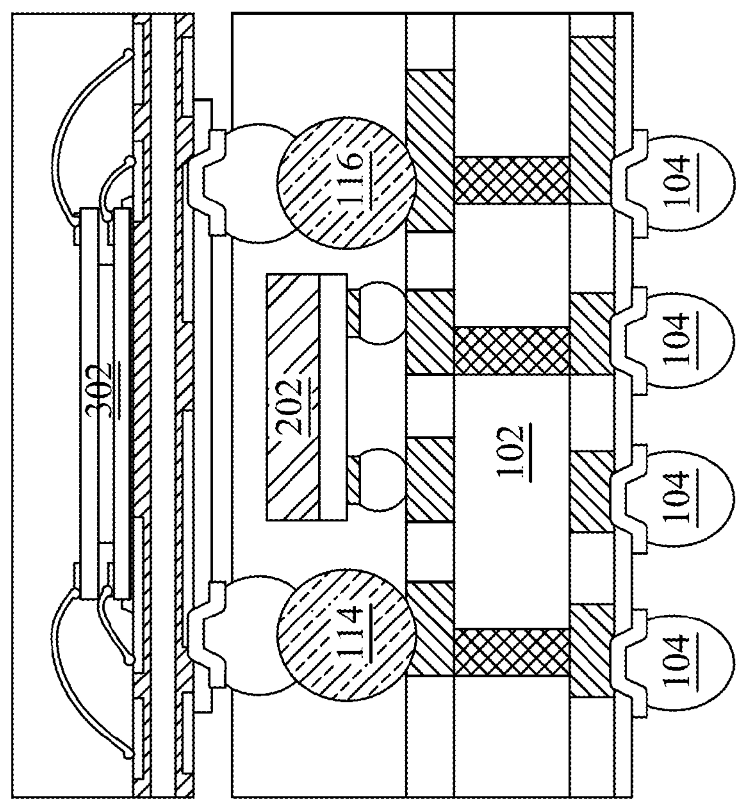
FIG. 8 illustrates a cross sectional view of the semiconductor device shown in FIG. 7 after a top package is mounted on the bottom package in accordance with various embodiments of the present disclosure.

FIG. 8 illustrates a cross sectional view of the semiconductor device shown in FIG. 7 after a top package is mounted on the bottom package in accordance with various embodiments of the present disclosure. The top package 302 may be bonded on the bottom package 102 through a reflow process. The bonding process comprises placing the solder balls against the respective copper balls. A reflow process is then performed to melt solder balls, thereby electrically connecting the copper balls to solder balls.

As shown in FIG. 8, the joint structure includes solder covered metal bumps (e.g., copper balls 114 and 116). The solder covered metal bumps include two portions, namely a solder portion and a metal bump portion. As shown in FIG. 8, the metal bump portion (e.g., copper balls 114 and 116) is fully embedded in the underfill layer 210. The solder portion is partially enclosed by the underfill layer 201.

Figure 9:
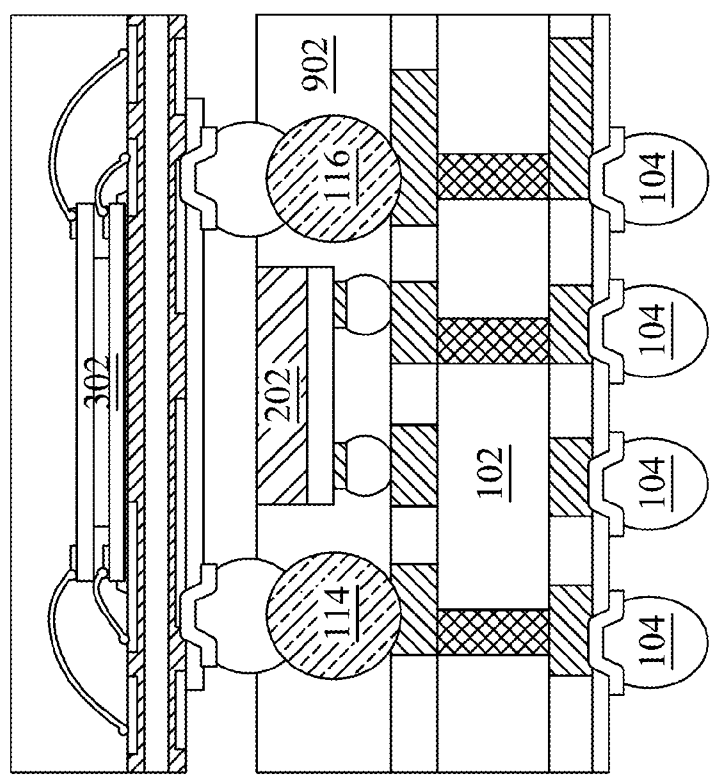
FIG. 9 illustrates a cross sectional view of another package-on-package semiconductor device in accordance with various embodiments of the present disclosure.

FIG. 9 illustrates a cross sectional view of another package-on-package semiconductor device in accordance with various embodiments of the present disclosure. The package-on-package semiconductor device 900 is similar to the package-on-package semiconductor device 100 shown in FIG. 8 except that the encapsulation layer 902 is formed by an exposed-die mold underfill (eMUF) process. In other words, the top surface of the semiconductor die 202 is exposed instead of being encapsulated by the underfill material (e.g., encapsulation layer 902). The eMUF process is well known, and hence is not discuss again to avoid repetition.

Figure 10:
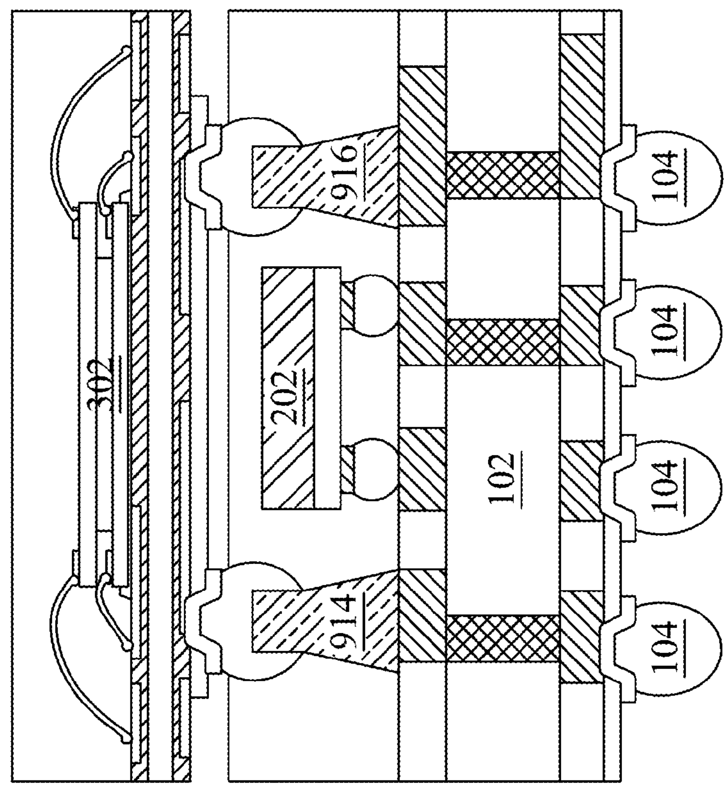
FIG. 10 illustrates a cross sectional view of yet another package-on-package semiconductor device in accordance with various embodiments of the present disclosure.

FIG. 10 illustrates a cross sectional view of yet another package-on-package semiconductor device in accordance with various embodiments of the present disclosure. The package-on-package semiconductor device 1000 is similar to the package-on-package semiconductor device 100 shown in FIG. 8 except that the copper balls 114 and 116 (shown in FIG. 8) are replaced by stud bumps 914 and 916. The stud bumps 914 and 916 may be formed of copper. Throughout the description, the stud bumps 914 and 916 may be alternatively referred to as copper studs 914 and 916.

It should be noted that the stud bumps 914 and 916 may be formed of other suitable materials such as gold, aluminum, silver, platinum, palladium, tin, any combinations thereof and/or the like. The stud bumps 914 and 916 are mounted on the bottom package 102 through suitable techniques such as using a wire-bonding tool. The stud bumps 914 and 916 may be formed in a process similar to wire-bonding, except the bond wire is broken, and hence leaving stud bumps 914 and 916.

Figure 11:
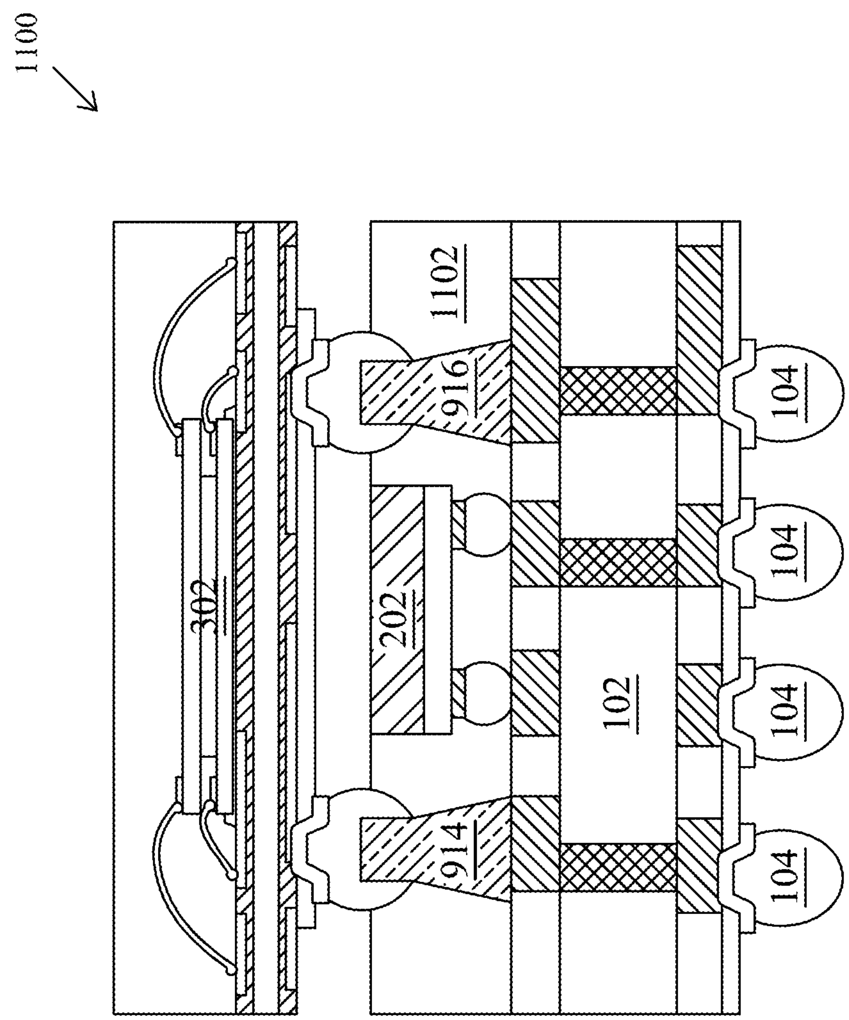
FIG. 11 illustrates a cross sectional view of yet another package-on-package semiconductor device in accordance with various embodiments of the present disclosure.

FIG. 11 illustrates a cross sectional view of yet another package-on-package semiconductor device in accordance with various embodiments of the present disclosure. The package-on-package semiconductor device 1100 is similar to the package-on-package semiconductor device 1000 shown in FIG. 10 except that the encapsulation layer is formed by an eMUF process. The eMUF process is well known, and hence is not discuss again to avoid repetition.

In accordance with an embodiment, a device comprises a bottom package comprising a plurality of metal bumps formed on a first side of the bottom package, wherein each metal bump is located in an opening of an underfill layer formed on the first side of the bottom package and a plurality of first bumps formed on a second side of the bottom package, a top package bonded on the bottom package, wherein the top package comprises a plurality of second bumps, and wherein second bumps and respective metal bumps form a joint structure and the underfill layer disposed between the top package and the bottom package.

In accordance with an embodiment, an apparatus comprises a top package mounted on a bottom package, a joint structure formed between the top package and the bottom package, wherein the joint structure comprises a solder covered metal bump and an underfill layer formed between the top package and the bottom package, wherein a metal bump portion of the joint structure is located in an opening of the underfill layer.

In accordance with an embodiment, a method comprises attaching a semiconductor die on a first side of a bottom package, wherein the bottom package comprises a plurality of metal bumps formed on the first side of the bottom package, forming an underfill layer over the first side of the bottom package, patterning the underfill layer to expose upper portions of the metal bumps, mounting a top package on the bottom package, wherein the top package comprises a plurality of solder balls and applying a reflow process so that the bottom package and the top package form a package-on-package structure, wherein the solder balls and respective metal bumps form a joint structure.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:

attaching a semiconductor die on a first side of a bottom package, wherein the bottom package comprises a plurality of metal bumps formed on the first side of the bottom package, and wherein a metal bump of the plurality of metal bumps comprises an upper portion rectangular in shape and a lower portion trapezoidal in shape, wherein a top surface of the upper portion is higher than a top surface of the semiconductor die and a top surface of the lower portion is lower than the top surface of the semiconductor die;

forming an underfill layer over the first side of the bottom package;

patterning the underfill layer to expose upper portions of the metal bumps;

mounting a top package on the bottom package, wherein the top package comprises a plurality of solder balls; and applying a reflow process so that the bottom package and the top package form a package-on-package structure, wherein the solder balls and respective metal bumps form a joint structure, and wherein the joint structure comprises the metal bump and a solder ball, and wherein, from a top view, a center of a top surface of the upper portion of the metal bump overlaps a center of the solder ball, and wherein the solder ball extends from a boundary of the upper portion and the lower portion of the metal bump.

2. The method of claim 1, further comprising:

attaching the semiconductor die on the bottom package through a plurality of micro bumps.

3. The method of claim 2, wherein:

forming the underfill layer over the first side of the bottom package, wherein the metal bumps and the semiconductor die are embedded in the underfill layer.

4. The method of claim 1, wherein:

the metal bumps are copper studs.

5. The method of claim 1, wherein:

after the step of patterning the underfill layer to expose upper portions of the metal bumps, an opening is formed in the underfill layer, and wherein a width of a bottom of the opening is equal to a width of the upper portion of the metal bump.

6. The method of claim 5, wherein:

an angle formed by sidewalls of the opening is about 60 degrees.

7. The method of claim 1, wherein:

the bottom package comprises a first redistribution line and a second redistribution line formed on the first side of the bottom package, a third redistribution line and a fourth redistribution line formed on a second side of the bottom package, a first through via, and a second through via, and wherein the third redistribution line is connected to the top package through the first via and the first redistribution line.

8. The method of claim 7, wherein:

a top surface of the first redistribution line is in direct contact with a bottom surface of the lower portion of the metal bump;

a bottom surface of the first redistribution line is in direct contact with a top surface of the first through via; and a bottom surface of the first through via is in direct contact with a top surface of the third redistribution line.

9. The method of claim 7, wherein:
the first through via and the second through via extend from the first side of the bottom package to the second side of the bottom package.

10. The method of claim 1, further comprising:
after the step of patterning the underfill layer to expose upper portions of the metal bumps and before the step of mounting the top package on the bottom package, forming a plurality of bumps on a second side of the bottom package.

11. A method comprising:
attaching a semiconductor die on a first side of a bottom package, wherein the bottom package comprises a first metal bump, a second metal bump, a first redistribution line, a second redistribution line, a first through via, a second through via and a third through via, wherein:
the first redistribution line and the second redistribution line are on the first side of the bottom package;
the first metal bump and the second metal bump are on and in contact with the first redistribution line and the second redistribution line, respectively;
the first through via, the second through via and the third through via extend from a top surface of the bottom package to a bottom surface of the bottom package; and
the semiconductor die is connected to the third through via through a micro bump and a third redistribution line, and wherein the third redistribution line is on the first side of the bottom package and between the first redistribution line and the second redistribution line;
forming an underfill layer over the first side of the bottom package;
patterning the underfill layer to form a first V-shaped opening over an upper portion of the first metal bump and a second V-shaped opening over an upper portion of the second metal bump;
after the step of patterning the underfill layer, forming a plurality of bumps on a second side of the bottom package;
after the step of forming the plurality of bumps on the second side of the bottom package, mounting a top package on the bottom package, wherein the top package comprises a first solder ball and a second solder ball; and
applying a reflow process so that the bottom package and the top package form a package-on-package structure, wherein the first solder ball and the first metal bump form a first joint structure as a result of applying the reflow process.

12. The method of claim 11, wherein:
the semiconductor die is between the first V-shaped opening and the second V-shaped opening.

13. The method of claim 11, wherein:
the first V-shaped opening has a first sidewall and a second sidewall, and wherein:
the first sidewall is a first straight slope extending from a first sidewall of the first metal bump to a top surface of the underfill layer; and
the second sidewall is a second straight slope extending from a second sidewall of the first metal bump to the top surface of the underfill layer.

14. The method of claim 13, wherein:
the first straight slope and the second straight slope form an angle of about 60 degrees.

15. The method of claim 11, wherein:
a top surface of the first redistribution line is in direct contact with a bottom surface of the first metal bump; and
a bottom surface of the first redistribution line is in direct contact with a top surface of the first through via.

16. The method of claim 11, wherein:
the bottom package comprises a plurality of active circuits.

17. A method comprising:
providing a bottom package comprising a first metal bump, a second metal bump, a first redistribution line, a second redistribution line, a third redistribution line, a first through via, a second through via and a third through via, wherein:
the first redistribution line, the second redistribution line and the third redistribution line are on a first side of the bottom package, and the third redistribution line is between the first redistribution line and the second redistribution line;
the first metal bump and the second metal bump are on and in contact with the first redistribution line and the second redistribution line, respectively; and
the first through via, the second through via and the third through are in contact with the first redistribution line, the second redistribution line and the third redistribution line, respectively;
attaching a semiconductor structure on the first side of the bottom package, wherein the semiconductor structure comprises a substrate, an isolation layer on the substrate, a redistribution layer on the isolation layer and a micro bump on the redistribution layer, wherein the micro bump is in direct contact with the third redistribution line;
forming an underfill layer over the first side of the bottom package;
patterning the underfill layer to form a first V-shaped opening over the first metal bump and a second V-shaped opening over the second metal bump, wherein the semiconductor structure is between the first V-shaped opening and the second V-shaped opening;
after the step of patterning the underfill layer, forming a plurality of bumps on a second side of the bottom package;
after the step of forming the plurality of bumps on the second side of the bottom package, mounting a top package on the bottom package, wherein the top package comprises a first solder ball and a second solder ball; and
applying a reflow process so that the bottom package and the top package form a package-on-package structure, wherein the first solder ball and the first metal bump form a first joint structure as a result of applying the reflow process, and wherein, from a top view, a center of a top surface of the first metal bump overlaps a center of the first solder ball.

18. The method of claim 17, wherein:
a bottom surface of the first metal bump is in direct contact with the first redistribution line; and
a bottom surface of the second metal bump is in direct contact with the second redistribution line, and wherein:
an outermost edge of the first metal bump is vertically aligned with an outermost edge of the first redistribution line; and an outermost edge of the second metal bump is vertically aligned with an outermost edge of the second redistribution line.

19. The method of claim 17, wherein:

the first metal bump comprises an upper portion rectangular in shape and a lower portion trapezoidal in shape, and wherein the first solder ball extends from a boundary of the upper portion and the lower portion of the first metal bump.

20. The method of claim 19, wherein:

a width of a bottom of the lower portion of the first metal bump is greater than a width of a bottom of the upper portion of the first metal bump.

* * * * *